United States Patent
Tsironis (10) Patent No.: US 11,863,148 B1
(45) Date of Patent: Jan. 2, 2024

(54) ACTIVE IMPEDANCE TUNER FOR BASE-BAND LOAD PULL

(71) Applicant: Christos Tsironis, Kirkland (CA)

(72) Inventor: Christos Tsironis, Kirkland (CA)

(*) Notice: Subject to any disclaimer, the term of this patent is extended or adjusted under 35 U.S.C. 154(b) by 33 days.

(21) Appl. No.: 17/376,922

(22) Filed: Jul. 15, 2021

(51) Int. Cl.
| | |
|---|---|
| H03H 11/02 | (2006.01) |
| G01R 35/00 | (2006.01) |
| G01R 31/28 | (2006.01) |
| H01P 1/38 | (2006.01) |

(52) U.S. Cl.
CPC ......... *H03H 11/02* (2013.01); *G01R 31/2822* (2013.01); *G01R 35/005* (2013.01); *H01P 1/38* (2013.01)

(58) Field of Classification Search
CPC .. H03H 11/02; G01R 31/2822; G01R 35/005; H01P 1/38
See application file for complete search history.

(56) References Cited

U.S. PATENT DOCUMENTS

| | | | | |
|---|---|---|---|---|
| 5,222,246 | A * | 6/1993 | Wolkstein | H03F 3/602 455/12.1 |
| 5,276,411 | A * | 1/1994 | Woodin, Jr. | H03H 7/383 333/116 |
| 6,801,784 | B1 * | 10/2004 | Rozenblit | H04W 52/52 455/69 |
| 7,646,267 | B1 | 1/2010 | Tsironis | |
| 7,680,468 | B2 * | 3/2010 | Rabjohn | H03F 1/345 375/291 |
| 8,971,874 | B2 * | 3/2015 | Han | H03F 1/565 455/67.14 |
| 9,310,410 | B1 | 4/2016 | Tsironis | |
| 9,331,670 | B1 * | 5/2016 | Mahmoudi | G01R 31/2608 |
| 9,900,060 | B1 * | 2/2018 | Keehr | H03H 7/185 |
| 10,972,150 | B2 * | 4/2021 | Keehr | H04B 5/0062 |
| 11,193,966 | B1 * | 12/2021 | Tsironis | H01P 5/04 |
| 2011/0025296 | A1 * | 2/2011 | Benedikt | G01R 31/2837 324/76.19 |
| 2014/0302797 | A1 * | 10/2014 | Han | H04W 24/06 455/67.14 |

FOREIGN PATENT DOCUMENTS

CA 2817228 A1 * 11/2013 ............. G01R 27/00

OTHER PUBLICATIONS

"Load Pull" [online] Wikipedia, [Retrieved on Aug. 24, 2017]. Retrieved from Internet <URL:wikipedia.org/wiki/Load_pull>.
"Computer Controlled Microwave Tuner—CCMT", Product Note 41, Focus Microwaves Jan. 1998, pp. 2-4.
(Continued)

*Primary Examiner* — Akm Zakaria (57) ABSTRACT

A base-band (kHz to MHz range) very low frequency active impedance tuner allows controlling the reflection factor at a multitude of frequencies in the base-band for systematic evaluation of the effect of bias networks on nonlinear quantities of a RF transistor, like EVM and ACPR. It comprises an electronically controlled active heterodyne feedback loop, frequency mixing, filtering and a remotely controlled digital electronic tuner. The digital electronic tuning feedback module operates at standard octave band GHz range, which allows controlling impedances over several decades in the base-band frequency range.

7 Claims, 10 Drawing Sheets

(56) References Cited

OTHER PUBLICATIONS

"Effect of out-of-band terminations on intermodulation distortion in common emitter circuits", V. Aperin et al., IEEE MTT-S Digest, pp. 977-980, 1999.
LFT-002001 (1020 MHz), datasheet Focus Microwaves.
PIN diode [online], Wikipedia [retrieved on Jun. 10, 2018]. Retrieved from Internet <URL: wikipedia.org/wiki/PIN_diode>.
"Introduction to Mixers, Lecture 15", Prof. Ali M. Niknejad, University of California, Berkeley, 2015.
Circulator [online], Wikipedia [retrieved on Mar. 7, 2019]. Retrieved from Internet <URL: wikipedia.org/wiki/Circulator>.
Low-pass filter [online], Wikipedia [retrieved on Mar. 7, 2019]. Retrieved from Internet <URL: wikipedia.org/wiki/Low-pass_filter>.
Amplifier [online], Wikipedia [retrieved on Mar. 7, 2019]. Retrieved from Internet <URL: wikipedia.org/wiki/Amplifier>.
SMA Bias Tee from 0.1MHz to 18GHz, Datasheet [online], Fairview Microwave [retrieved on May 21, 2021]. Retrieved from Internet <URL: fairviewmicrowave.com/images/productPDF/SB18000A.pdf>.
Heterodyne [online], Wikipedia [retrieved on Mar. 3, 2019]. Retrieved from Internet <URL: wikipedia.org/wiki/Heterodyne>.
Image Rejection Mixer [online], electronicsnotes [retrieved on May 21, 2021]. Retrieved from Internet <URL: electronics-notes.com/articles/radio/rf-mixer/image-rejection-mixer.php>.

* cited by examiner

ACTIVE IMPEDANCE TUNER FOR BASE-BAND LOAD PULL

PRIORITY CLAIM

Not applicable.

CROSS-REFERENCE TO RELATED ARTICLES

1. Load Pull, online, Wikipedia [Retrieved on 2017 Aug. 24]. Retrieved from Internet <URL: wikipedia.org/wiki/Load_pull>.
2. "Computer Controlled Microwave Tuner, CCMT", Product Note 41, Focus Microwaves Inc., January 1998, pages 2-4.
3. "Effect of out-of-band terminations on intermodulation distortion in common emitter circuits", V. Aperin et al., IEEE MTT-S Digest, pp 977-980, 1999.
4. Tsironis, C., U.S. Pat. No. 7,646,267, "Low frequency electro-mechanical impedance tuner".
5. Tsironis, C., U.S. Pat. No. 9,310,410, "Load and Source pull test system for RF and baseband frequencies".
6. LFT-002001 (1020 MHz), datasheet Focus Microwaves.
7. PIN diode [online], Wikipedia [retrieved on 2018 Jun. 10]. Retrieved from Internet <URL: wikipedia.org/wiki/PIN_diode>.
8. "Introduction to Mixers, Lecture 15", Prof. Ali M. Niknejad, University of California, Berkeley, 2015.
9. Circulator [online], Wikipedia [retrieved on 2019 Mar. 7]. Retrieved from Internet <URL: wikipedia.org/wiki/Circulator>.
10. Low-pass filter [online], Wikipedia [retrieved on 2019 Mar. 7]. Retrieved from Internet <URL: wikipedia.org/wiki/Low-pass_filter>.
11. Amplifier [online], Wikipedia [retrieved on 2019 Mar. 7]. Retrieved from Internet <URL: wikipedia.org/wiki/Amplifier>.
12. SMA Bias Tee from 0.1 MHz to 18 GHz, Datasheet [online], Fairview Microwave [retrieved on 2021 May 21]. Retrieved from Internet <URL: fairviewmicrowave.com/images/productPDF/SB18000A.pdf>.
13. Woodin, C. et al. U.S. Pat. No. 5,276,411, "High power solid state programmable load".
14. Heterodyne [online], Wikipedia [retrieved on 2019 Mar. 3]. Retrieved from Internet <URL: wikipedia.org/wiki/Heterodyne>.
15. Image Rejection Mixer [online], electronicsnotes [retrieved on 2021 May 21]. Retrieved from Internet <URL: electronics-notes.com/articles/radio/rf-mixer/image-rejection-mixer.php>.

BACKGROUND OF THE INVENTION AND PRIOR ART

Notice: Numbers of items in figures start with the number of the figure; ex:20 is in FIG. 2, 112 is in FIG. 11 . . .

This invention relates to Non-50Ω load pull testing (see ref. 1) of RF (radio frequency) transistor and other active components (DUT). Load pull is a method by which the load or source impedance presented to the DUT at a given frequency is changed systematically using an impedance tuner (see ref. 2) and the DUT performance is measured, with the objective to find optimum biasing and embedding (matching) networks for the overall RF network design objectives, such as maximum RF gain, output RF power, efficiency, linearity or else, and determine the necessary load and source impedances to be presented to the DUT to obtain the targeted performance.

Figure 1:
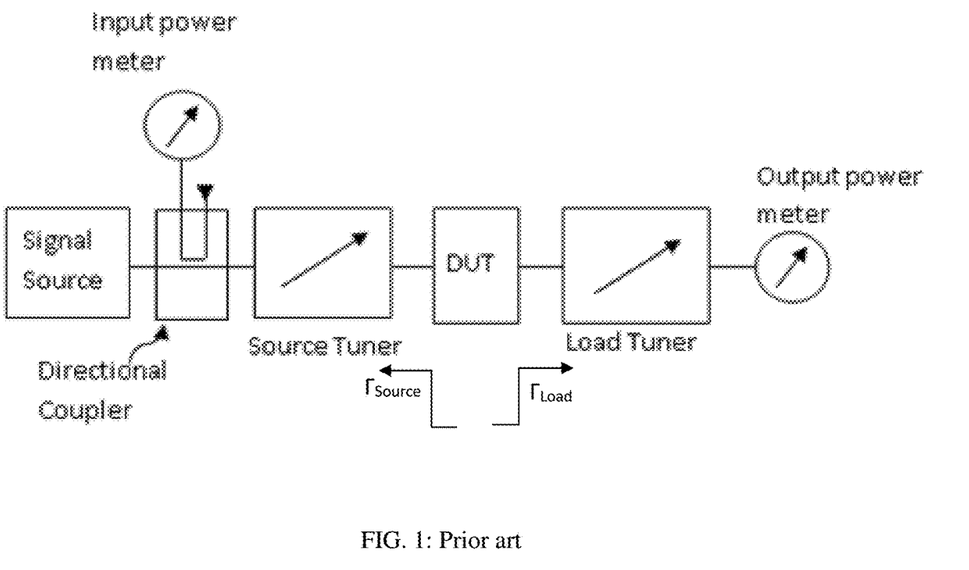
FIG. 1 depicts prior art, a typical scalar (measuring amplitude only) load pull test system using pre-calibrated passive tuners.

A prior art scalar load/source pull test system is shown in FIG. 1: it includes a radio frequency (RF) signal source, source (input) and load (output) impedance tuners (see ref. 2), a device under test (DUT) housed in a coaxial or microstrip test fixture or, when in form of a micro-chip on a semiconductor wafer, accessed using microscopic wafer probes, and input and output measurement instruments. The instruments can measure power, control and measure DC bias and measure various spectral components, generated either by the (modulated) signal source and modified by the DUT, or generated internally by the non-linearities of the DUT itself. The tuners and the instruments are controlled by a PC controller using appropriate digital communication protocols (GPIB, USB, RS 232, LAN etc.). The data acquired from the instruments via the test software include RF and DC response of the DUT to input stimulus for given source and load impedances. The data are saved in load pull files and serve (a) to qualify the DUT regarding some target specifications and (b) to design optimum source and load matching networks for given target performance, this being Output Power, Efficiency, or Linearity described through Intermod (IMD), Adjacent Channel Power Ratio (ACPR), Error Vector Modulation (EVM) etc.

The effect of the base-band (envelope frequency) impedance on the linearity of the active devices has been reported before (see ref. 3). Commercial solutions for the control and the calibrated measurement of these base-band impedances are, thus, available using passive tuners, only at frequencies as low as such tuners can operate, this being no lower than 10 MHz (see ref. 4, 5 and 6). An additional limitation arises when considering on-wafer active device characterization set-ups, because of the insertion loss of the wafer-probe access path, which reduces the effective tuning range of passive tuners. The use of conventional bias networks (FIG. 3 and ref. 12) in combination with controlled DC sources 22, 202 for the biasing of the DUT 24, yields undefined base-band impedances. Although not problematic in small-signal measurements, large signal linearity characterization, like a two-tone or modulation signal testing, requires information and control of the impedance at the base-band frequency, because of the up- and down-conversion mechanism in the nonlinear DUT (FIG. 4 in ref. 4). For these reasons, an active tuner, that can operate between 0.1 and 10 MHz and compensate for the insertion loss, is preferable for the control and calibrated measurement of the envelope/base-band device terminations in a test fixture or on-wafer environment. The proposed solution with its associated calibration procedure can be integrated as part of a load-pull test system and is particularly useful for nonlinear device characterization including the implementation of the base-band impedance control.

Active tuning is the method of creating a load impedance not by reflecting signal on a real (passive) load (input or output) tuner, but by injecting into the DUT a signal synchronized (coherent) with the signal exiting from the DUT (which corresponds also to the source signal); this injected signal can be generated either by sampling source signal before it enters the DUT or after it exits the DUT; in both cases this sampled signal portion must be amplified and re-injected into the DUT. By controlling amplitude and phase of this re-injected signal, one can control the complex load impedance (Z=Real(Z)+j*Imag(Z)) or admittance Y=1/Z and, by using amplification, one can re-inject more power <a> into the DUT than the power <b> the DUT injects into the load, thus creating a reflection factor Γ=<a>/<b> that may exceed 1 (see area of the test port in FIG. 4). This capacity of active systems is used to compensate for insertion loss of the networks embedding the DUT (cables, adapters, test fixtures bias tees or wafer-probes). In terms of equations $\Gamma_{Load}$=<a>/<b>, with <b> created by the DUT and <a> created by the injection, wherein <a> can be smaller, equal or larger than <b>, whereby 0<|Γ|<1, Γ=|Γ|*exp(j*Φ), 0≤Φ<2π, and Z=1/Y=(1+Γ)/(1−Γ).

Digital electronic tuners (see ref. 13) are twoports having an input and an output port; they use microstrip transmission lines and several PIN diodes (see ref. 7), mounted and biased along and between the transmission lines and ground (FIG. 2 in ref. 12). The diodes are switched ON and OFF by an electronic controller in various permutations. M diodes allow up to $2^M$ permutations: 10 diodes allow 1024 permutations or tuner states (FIG. 8), 14 diodes 16,384 states etc.; the combined effect of the diode switching appears at the input port of the tuner as a digitally controlled impedance or reflection factor TET (FIG. 5); in our case the output port is terminated with the characteristic impedance $Z_0$=50 Ohm; circulators, simple and image rejection mixers, amplifiers and low pass filters are standard components, commercially available in a large variety of configurations and bandwidths (see ref. 8 to 11). Digital electronic tuners and circulators have limitations: the digital electronic tuners generate irregular reflection factor point distribution over the Smith chart (FIG. 8), have limited tuning range and relatively high insertion loss, due to the dielectrically loaded microstrip transmission lines used. Multi-octave digital electronic tuners, although feasible, require in-depth knowledge of the design and manufacturing technology and are not commercially available. Circulators, on the other hand, are commercially available but critically band-limited (see ref. 9); circulators exist only above several hundred MHz. Frequency mixers and image rejection mixers (see ref. 8 and 15) are commercially available in narrow and large band form. Frequency mixers have typically one high frequency (RF) signal port, one pump (local oscillator, LO) port and a low to inter-medium (IF) frequency port. In frequency terms $F_{IF}=F_{RF}-F_{LO}$ (high sideband) or $F_{IF}=F_{LO}-F_{RF}$ (low sideband). The nonlinear characteristic of the diodes used in the mixers creates also higher frequency sideband products and must therefore, be suppressed using low pass filters (see ref. 10). The basic mixer response comes from the product of two sinus signals generated by the nonlinearity of the diodes in the mixer: $\sin\omega_1 t*\sin\omega_2 t=\frac{1}{2}*\{\cos(\omega_1-\omega_2)t-\cos(\omega_1+\omega_2)t\}$, wherein, in our case, $\omega_1=2\pi F_{IF}$ and $\omega_2=2\lambda F_{LO}$ means there are primary RF frequency components $2\pi(F_{LO}-F_{IF})$ and $2\pi(F_{LO}+F_{IF})$ that have to be processed by the digital tuning module (FIGS. 3 and 4) and secondary RF frequency components $2\pi(2F_{LO}\pm F_{IF})$ that have to be suppressed using a low pass filter.

BRIEF SUMMARY OF THE INVENTION

The proposed very low frequency load pull tuner uses the heterodyne (see ref. 14) principle (FIG. 6) and allows for making a real low frequency wideband active impedance tuner: both, octave-band or less wideband circulator (see ref. 9) and electronic tuner technology's prohibitive limitations at low (MHz range) frequencies are bypassed with a single stroke, using the heterodyne concept: the low base-band frequency signal is mixed up into the local-oscillator (LO) frequency range around 1 to 4 GHz, which is commonly used by circulators and electronic tuners, controlled in amplitude and phase and converted down again to low base-band frequencies to be amplified by inexpensive low frequency power amplifiers (see ref. 11) and injected back into the DUT, to create the virtual "active" load; both the circulator and the attached to it electronic tuner are not required to cover the base-band operation frequency; the usual frequency bandwidth of circulators and electronic tuners at RF frequencies are sufficient to cover multi-octave base-band frequency operation.

DETAILED DESCRIPTION OF THE DRAWINGS

The invention and its mode of operation will be better understood from the following detailed description when read with the appended drawings in which:

FIG. 10A through 10B depict prior art: the nomenclature and definitions of conversion modules/mixers and image rejection mixers (IRM); FIG. 10A depicts the up-converter module using mixer 1 and FIG. 10B depicts the down-converter module using mixer 2; the exponential frequency format Fi=$2^N$*δF is used here as an example.

DETAILED DESCRIPTION OF THE INVENTION

Figure 5:
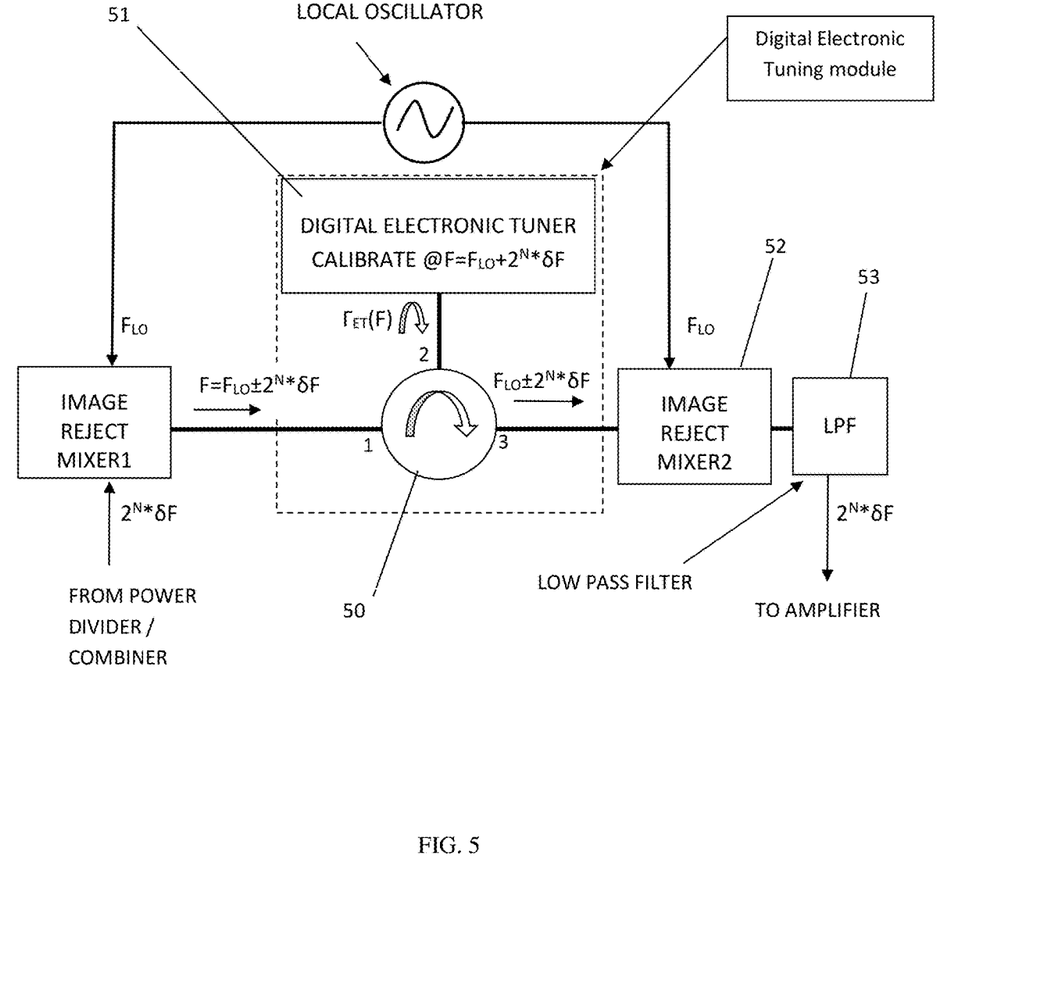
FIG. 5 depicts the core mechanism of up- and down-conversion and impedance control using mixers (or image reject mixers), a circulator and a digital electronic tuning module; the exponential frequency format Fi=$2^N$*δF is used here as an example.
Figure 6:
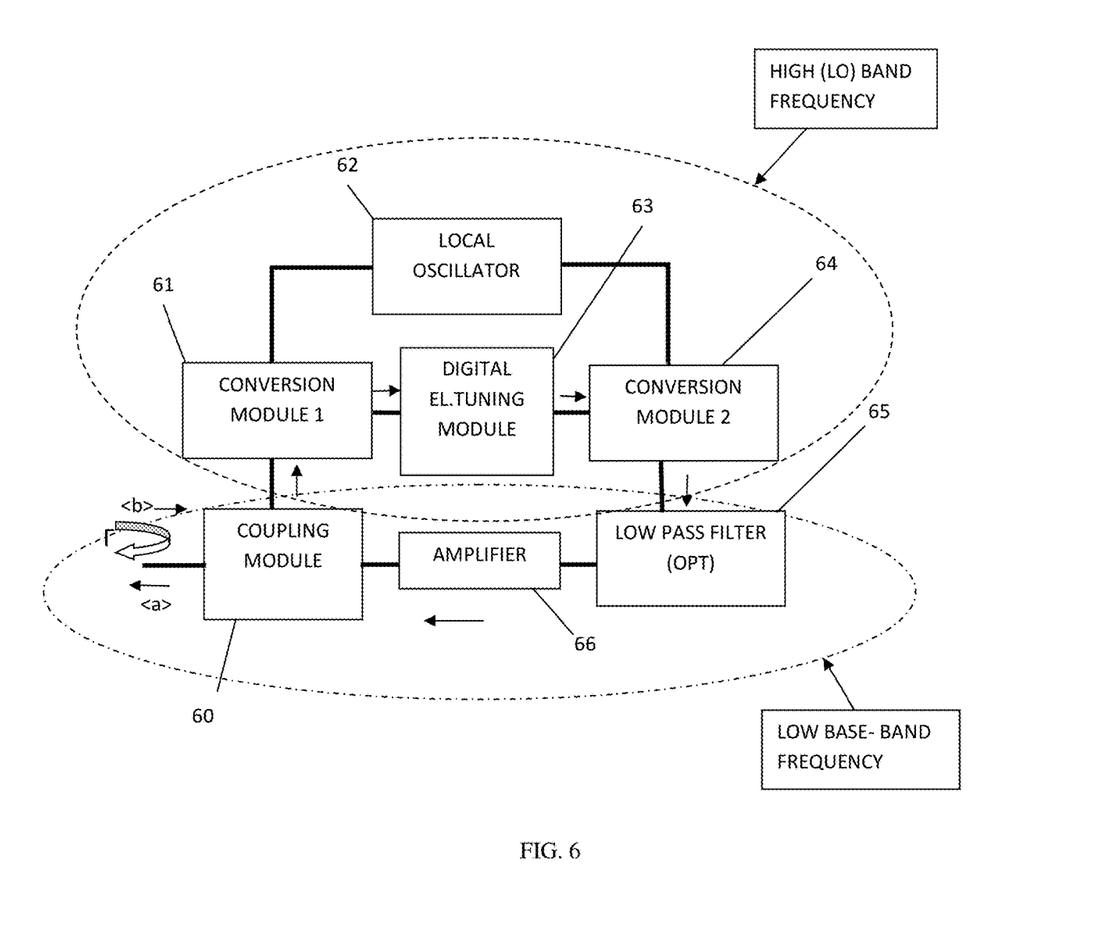
FIG. 6 depicts the overall concept of the VLFT and the prevalent frequency domains.

The overall concept of the very low frequency active impedance tuner (VLFT) for base-band load/source pull testing is demonstrated in FIG. 6: any base-band signal component <b> at a frequency Fi, wherein Fi can be any of a multitude of frequency components, chosen either randomly, following a linear law Fi=(N+1)*δF, or exponentially Fi=$2^N$*δF, etc., with N=0, 1, 2, 3 . . . 5, enters the tuner into the input port of the coupling module 60. Since multi-octave directional couplers in the kHz or low MHz range are not available, the coupling module uses a signal combiner/divider (SCD) 97 (FIG. 9) as coupling module. This type of coupling module has one common (CP) port (the test port of the active tuner) and two input/output (I/O) ports. A first I/O port is used as output port of the coupling module and is connected with an up-conversion module 61. This module transfers the very low frequency component Fi of the base-band to RF frequencies around the local oscillator 62 frequency $F_{LO}$, which is in the GHz frequency range. The frequency products of this up-conversion are injected into the digital electronic tuning module 63, of which the operation mechanism is outlined in FIG. 5. This digital electronic tuning module modifies amplitude and phase of this entering signal by reflection and re-injection at port 2 of the circulator 50, using a selection of tuning states of the digital electronic tuner 51, and injects it from port 3 of the circulator into a down-conversion module 64. The outgoing spectrum includes a low frequency component in the base-band area and a high frequency component around the double local oscillation frequency, which is cut off using the low pass filter 65, which, if the mixers used are not image rejection mixers (see ref. 15), will be required. The outcoming base-band signal is then amplified by the amplifier 66 and injected into the output (I/O) port of the coupling module 60. The output port of module 60 is the second I/O port of the signal combiner divider 97 (see FIG. 9).

Figure 2:
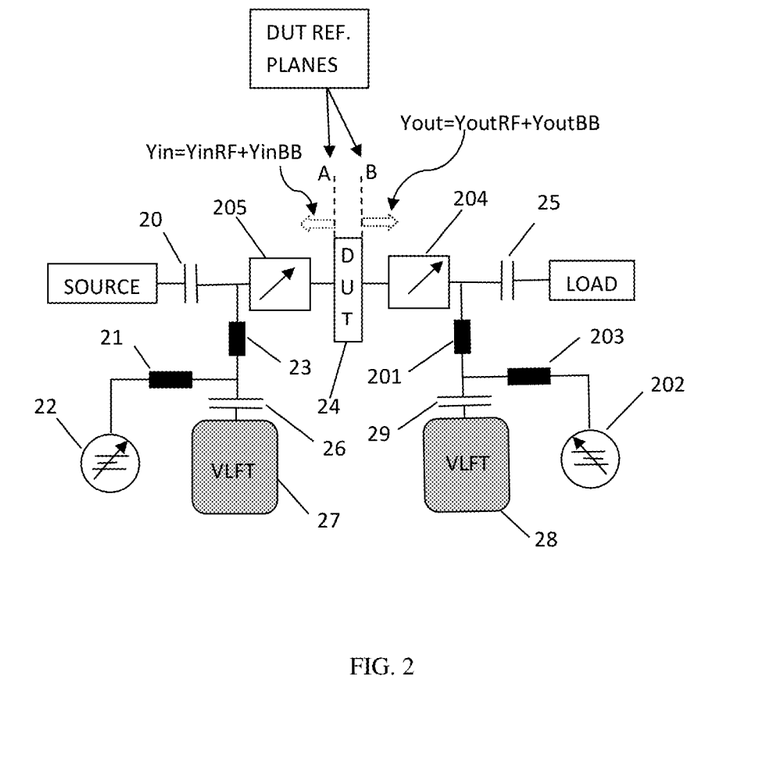
FIG. 2 depicts the concept of base-band load and source pull using very low frequency tuners (VLFT) operating through the bias networks.
Figure 3:
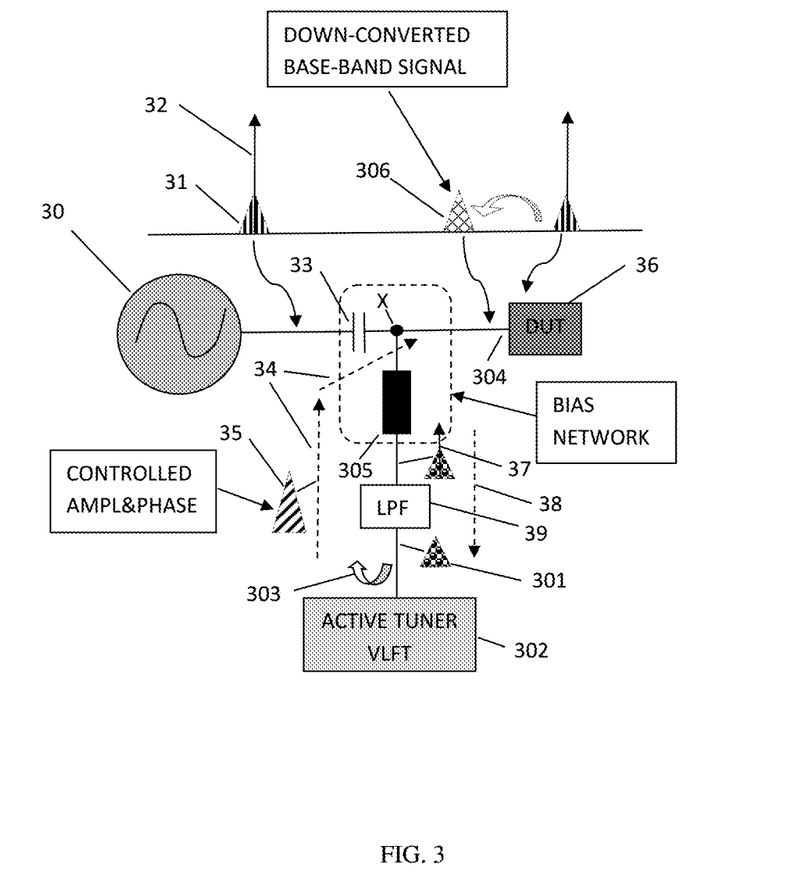
FIG. 3 depicts schematically the base-band spectrum propagation and processing along the RF and DC bias network lines of the test setup.

The load/source pull implementation of the very low frequency active impedance tuner (VLFT) is shown in FIGS. 2 and 3: The DC bias line leading to the input (or output) port 304 of the DUT 36 is connected at node X to the test port of the active tuner (shown in detail in FIG. 4) through the inductor 305 and an optional low pass filter LPF 39. The input signal originates at the signal source 30 and includes a carrier frequency 32 and low-level sidebands (base-band signals) 31; this signal traverses the capacitor 33, is injected into the input port 304 of the DUT, is amplified by the DUT and is extracted from the DUT output port (not shown). The (nonlinear) DUT creates up- and down-converted 306 base-band signals both at its input and output terminals, which signals 37 containing the reduced carrier 32 travel 38 along the DC bias network inductor 305 through the low pass filter 39 to the VLFT 302; on the way the inductor 305 suppresses the carrier from a 32 level amplitude to a 37 level amplitude and after the LPF 39 only the baseband 301 signal components remain. The VLFT tuner creates an active reflection 303 which transforms the base-band signal 301 to the amplitude and phase modulated base-band signal 35; this modified base-band signal 35 travels back 34, reaches the main line at node X and interacts with the original base-band signals and is injected into port 304 of the DUT 36, because the low value capacitor 33 prevents the low frequency base-band signal 35 from travelling back to the signal source 30; this injected-back base-band signal 35 interacts with the internal cross-modulation mechanisms of the DUT. If this returning signal is properly modified in amplitude and phase, its interaction with the internal nonlinear mixing of the DUT affects spectral phenomena such as ACPR and EVM that can this way be controlled and optimized. This is the essence of the base-band load/source pull measurement method.

The concept is applicable both to the input and output side of the DUT. This is shown in FIG. 2. The DUT sees two admittances Yin at its input and Yout at its output port. At the input the admittance is composed by a parallel connection of the RF admittance YinRF and the base-band admittance YinBB; the YinRF admittance is created by the impedance tuners 205 and 204 cascaded with the (quasi transparent at RF) low value capacitor 20 and the (typically) 50 Ohm internal impedance of the source. The YinBB admittance is created by the inductors 23 and 21, the capacitor 26 and the active VLFT tuner 27, since the low value capacitor 20 represents a quasi-open circuit at base-band frequencies. The low value capacitor 20 is transparent for the RF frequency signals but blocks the stand-alone base-band signals travelling between the capacitor 20 and the DUT 24 through the (transparent for very low frequencies), slide screw impedance tuner 205 (see ref. 2). The base-band signal traverses the inductor 23 and the capacitor 26 and allows the VLFT active tuner 27 to modify and reflect it back (as shown as item 303 in FIG. 3) and send it back to the DUT. Inductor 21 is a chock that is dimensioned to block the base-band signal from escaping, but to allow DC current through coming from the bias supply (or battery) 22. The same mechanism repeats on the output side of the DUT 24; the output admittance Yout is composed by the parallel sum of YoutRF and YoutBB, wherein YoutRF is created by tuner 204 and YoutBB by the combined inductors 201 and 203, the capacitors 25 and 29 and the active VLFT tuner 28; again capacitor 25 and inductor 203 block the base-band frequencies and capacitor 29 blocks the DC current. DC bias is controlled by the bias supply 202. This is important for the calibration of the system, since in FIG. 7 only the input side at reference plane A is shown for the economy of the presentation, whereas all procedures apply equally to the output side et reference plane B.

Figure 4:
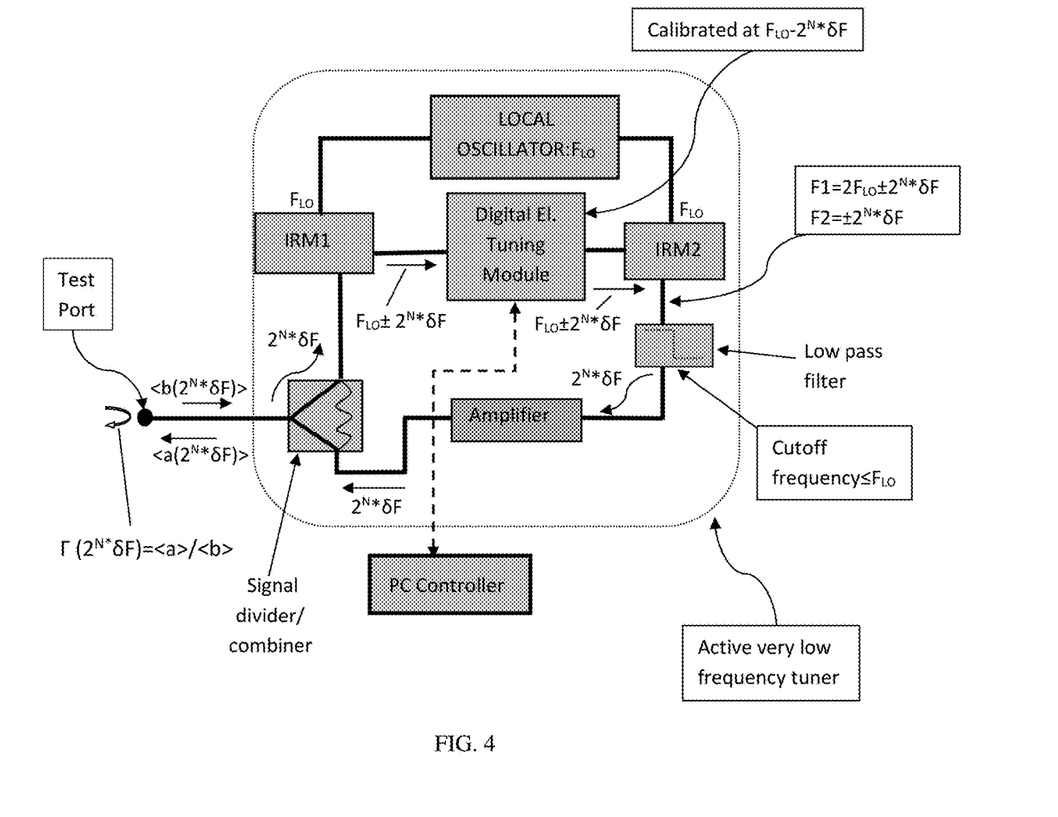
FIG. 4 depicts the embodiment of the heterodyne very low frequency active impedance tuner, VLFT; the exponential frequency format Fi=$2^N$*δF is used as an example.

The complete very low frequency active tuner is shown in a basic embodiment in FIG. 4: it includes a signal divider/combiner, two simple or image rejection mixers (IRM) 1 and 2, a digital electronic tuning module, an optional low pass filter, and an amplifier. Qualitatively the apparatus works as follows: knowing that the base-band signal includes a multitude of signal components Fi, we choose to select a representative number of base-band frequencies following either a linear relation Fi=(N+1)*SF or an exponential relation Fi=$2^N$*δF, wherein N=0, 1, 2, 3 . . . 5 and SF typically 0.05 to 0.1 MHz; the exponential law covers a wider frequency band without increasing the number of frequencies Fi. A low frequency, or base-band signal component <b($2^N$*δF)> entering into the test port is split in two parts: one part travels through to mixer IRM1, is up-converted with the signal of the local oscillator $F_{LO}$ to $F_{LO}$±$2^N$*δF and enters the digital tuning module; processing inside the digital tuning module is shown in FIG. 5: the signal enters into port 1 of the circulator 50 and exits from port 2; there it is reflected back by the digital electronic tuner 51, which is calibrated at the frequency $F_{LO}$+$2^N$*δF; the reflected signal exits from port 3 and is injected into mixer 2 (IRM2) 52. Mixer 2 generates two sidebands: F1=2$F_{LO}$±$2^N$*δF and F2=±$2^N$*δF; the low pass filter 53 eliminates F1 and allows only signal power at F2 to proceed to the amplifier 98 and, through the signal combiner 97 back to the test port, where it arrives as <a($2^N$*δF)> to generate the virtual reflection factor Γ($2^N$*δF)=<a($2^N$*δF)>/<b($2^N$*δF)> for each specific base-band signal component $2^N$*δF.

FIG. 5 is a comprehensive presentation of the frequency conversion and processing mechanism showing how impedances at the very low base-band frequency components (N+1)*δF or $2^N$*δF, wherein δF is of the order of 0.1 to 1 MHz and N varies usually from 0 to 5, for which usual RF components, like directional couplers, circulators and automatic impedance tuners, simply do not exist. Instead, the base-band frequency Fi=(N+1)*δF or Fi=$2^N$*δF can be controlled by transferring it and operating into a frequency range where such components are readily available, rendering the solution realistic and practical. Last, not least, a less than one octave 1 GHz frequency bandwidth at the local oscillator frequency range, which is quite ordinary in a range from 2-3 GHz, may generate control over several decades of base-band frequency bandwidth in the range between 100 kHz and 100 MHz (0.1-1 MHz, 1-10 MHz, 10-100 MHz); this kind of base-band bandwidth is required when dealing with high speed modulated telecommunication signal processing. As an example: a base-band frequency component $2^N*\delta F=1$ MHz and a local oscillator frequency of $F_{LO}=2.000$ MHz is upconverted by mixer 1 to Fi=2.000±1 MHz, processed by the circulator and the digital electronic tuner at this frequency Fi and is send to mixer 2 to be down-converted, after low pass filtering, back to $2^N*\delta F=1$ MHz. Since the electronic tuner is calibrated at one of the two sidebands, this is the information carried forward: mixer 2 creates the sum and the difference between Fi and $F_{LO}$: 2.000±1 MHz-2.000 MHz=±1 MHz and 2.000±1 MHz+2.000 MHz=4.000±1 MHz; the low pass filter easily suppresses the 4 GHz component and the remaining signal is the baseband 1 MHz with controlled amplitude and phase to be amplified and sent back to the DUT.

Figure 10A:
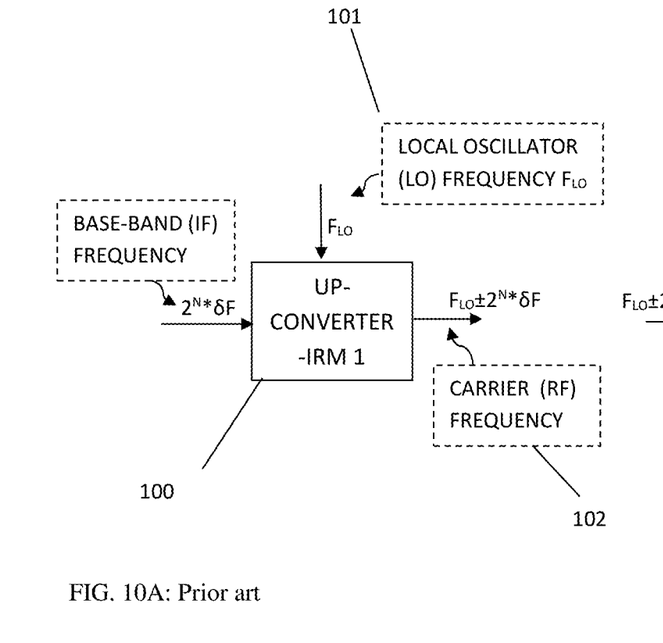
Figure 10B:
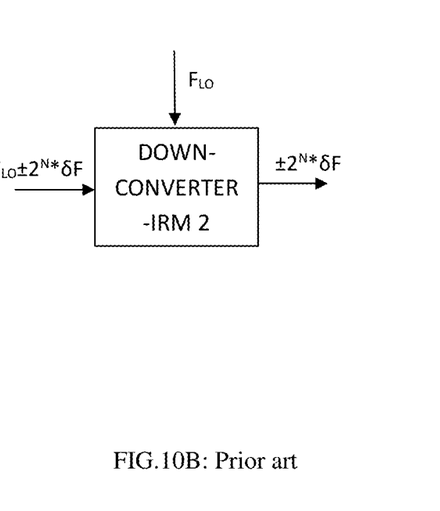

FIGS. 10A and 10B clarify the operation of a frequency mixer that can be used for up-conversion from the base-band to the local oscillator high (carrier) frequency range and from the high frequency back to the base-band range. Image rejection mixers are more complicated and allow at least partial suppression of undesired signal mixing products (see ref. 15) at the input port of the coupling module; a portion of the baseband 2N*δF signal is coupled out and injected into the IF port of the up-conversion module 100 (Mixer 1). There it is mixed up with the pump LO signal of the high frequency local oscillator 101 (GHz range) and generates an RF (GHz range) output signal around $F_{LO}$ which is now the carrier frequency 102. This RF signal ($F_{LO} \pm 2^N*\delta F$) is injected into the first port 1 of the circulator 50 (FIG. 5); in a circulator the signal is transferred quasi without insertion loss from port 1 to port 2, from port 2 to port 3 and back from port 3 to port 1; there is no transmission from port 2 to port 1 or from port 3 to port 2; the signal is then transferred, with minimal loss, from port 1 to port 2 of the circulator, where it is injected and reflected back at the test port of the digital electronic tuner 51, whose idle port is terminated with the characteristic impedance Zo (50 Ohm). The modified signal with controlled amplitude and phase is then injected into mixer 52 and cleaned up from the higher mixing products using low pass filter 53 to be injected into the amplifier 98 and back to the DUT. With regards to bandwidth this architecture allows a several octave base-band operations: for instance, a simple one octave wide 1-2 GHz circulator and a standard 1-2 GHz electronic tuner, combined with a 995 MHz local oscillator will cover 5-1005 MHz IF operation bandwidth, or 7.7 octaves ($1005/5=201 \approx 2^{7.7}$). This has never been expected to be feasible up to now; of course, the practical setup will also be associated with the availability of adjustable or exchangeable low-pass or band-pass filters in the up- and down-conversion paths.

Figure 8:
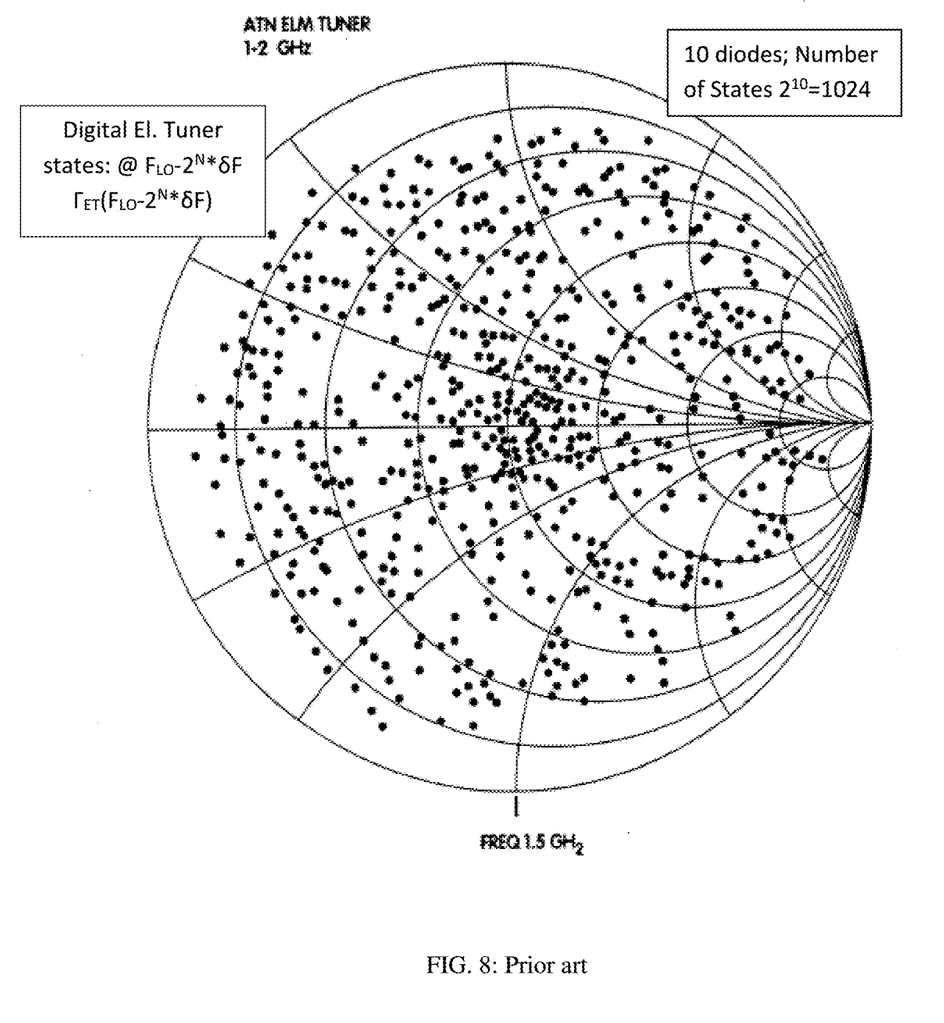
FIG. 8 depicts prior art: typical impedance pattern generated by a 10-diode digital electronic tuner (see ref. 12); the exponential frequency format Fi=$2^N$*δF is used as an example.
Figure 9:
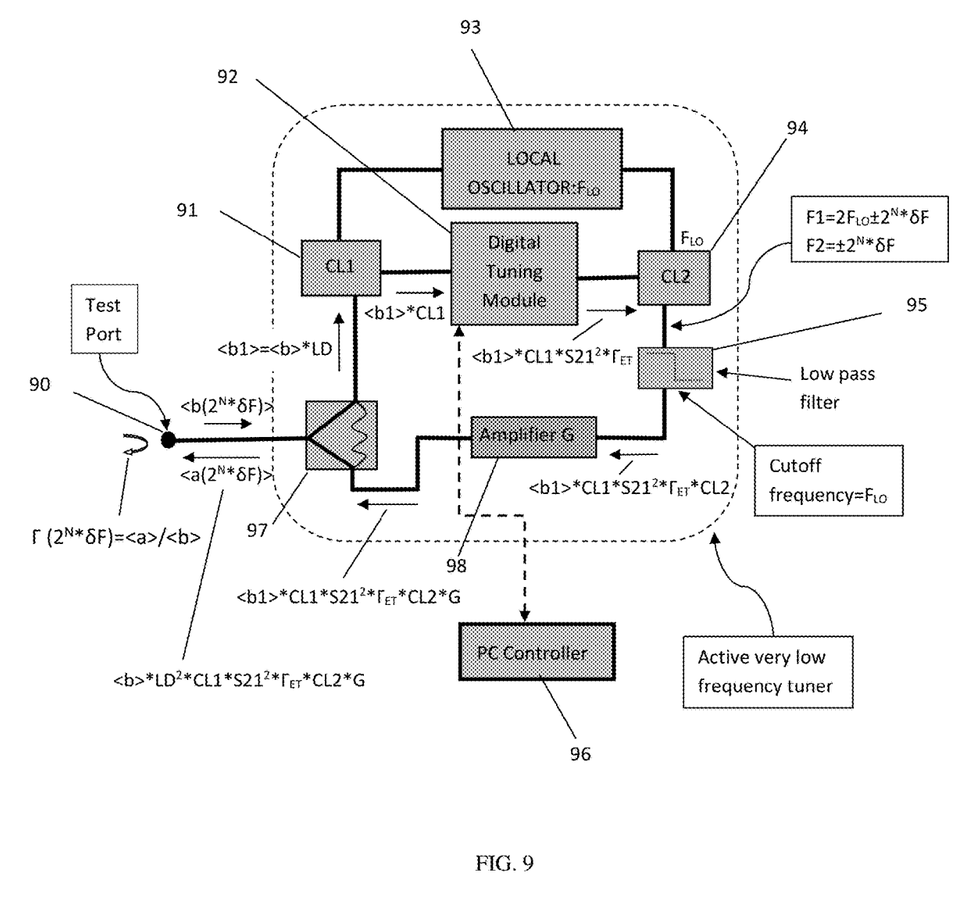
FIG. 9 depicts the conceptual signal flow, treatment and relations in the very low frequency active impedance tuner of FIG. 4; the exponential frequency format Fi=$2^N$*δF is used here as an example; LD=loss of divider/combiner, CL=conversion loss of mixer; G=gain of amplifier; S21 (≈S32)=transfer factor of circulator.

The signal flow and processing, controlled by PC 96, are schematically shown in FIG. 9: a base-band frequency component $<b(2^N*\delta F)>$ enters the test port 90; it splits in two equal parts at the signal combiner/divider (SCD) 97. One part, $<b1>=<b>*LD$ attenuated by the splitting factor LD ($\approx 0.5$ or $-3$ dB) proceeds to the up-conversion module 91, powered by the local oscillator 93, where it is up-converted to the range of the local oscillator $F_{LO}$ frequency. This conversion reduces the signal by the conversion loss CL1 (typically a factor 0.2 or $\approx -7$ dB) to $<b1>*CL1$; the digital tuning module 92 modulates the amplitude and phase of this signal and the outcome is approximately $<b1>*CL1*S21^2*TET$; herein it is assumed that the transmission factors of the circulator 50 between its ports 1 and 2 (S21) and 2 and 3 (S32) are quasi equal and considered here to be equal to S21; The reflection factor TET at the test port of the digital electronic tuner 51 is spread over the Smith chart as shown in FIG. 8. The processed signal $<b1>*CL1*S21^2*TET$ then enters down-conversion module 94 and exits reduced by the conversion loss CL2 to $<b1>*CL1*CL2*S21^2*TET$; the high frequency components are previously suppressed by the low pass filter 95, of which the low insertion loss is here included in the factors S21. The remaining signal is amplified G by the amplifier 98 and reaches the DUT after losing again half of its amplitude at the SCD 97 as: $<a> \approx <b>LD^2*CL1*CL2*S21^2*\Gamma_{ET}*G$, leading to $\Gamma \approx LD^2*CL1*CL2*S21^2*G*TET$; assuming LD=0.5, S21=0.95 and CL1$\approx$CL2$\approx$0.2, this leads to $\Gamma \approx 0.009*G*\Gamma_{ET}$. This means two things: (1) that the digital tuner $\Gamma_{ET}$ fully controls $\Gamma$ and (2) that a moderate amplifier gain of 20 dB (100) to 25 dB (300) is able to compensate for the factor 0.009 and generate a $|\Gamma|$ up to 1, which are the objectives of any active load/source pull system.

The digital electronic tuner 51 used in the digital electronic tuning module (FIG. 5) has the major advantage of allowing high tuning speed between the irregular (FIG. 8), but still sufficiently spread over the Smith chart, tuner states in the range of milli-seconds, compared with several seconds required by mechanical tuners. The use of the heterodyne concept also allows using a single, inexpensive, fixed frequency internal or external local oscillator, instead of an external variable frequency signal generator.

At medium or high-power signal operation, active tuners cannot be used in an open-loop environment, i.e., they cannot be calibrated ahead of time for the calibration data to be used posteriori in actual measurements. The reason for that is that active tuners include amplifiers, and the gain of amplifiers becomes notoriously non-linear in amplitude and phase when compressed, i.e. when the input or output power exceeds a certain level. In the case of the very low signal level signal components at the base-band frequencies discussed here, though, this is not the case. The base-band active tuner can be calibrated and the calibration can be used for upcoming measurements, since the amplifier is presumed to remain linear throughout the test sequence. The active base-band tuner to be used in base-band load pull (FIG. 2) is calibrated as follows: the input A (or output B) terminal of the test setup facing the DUT as seen in FIG. 2 is connected to a pre-calibrated VNA (FIG. 7).

Figure 7:
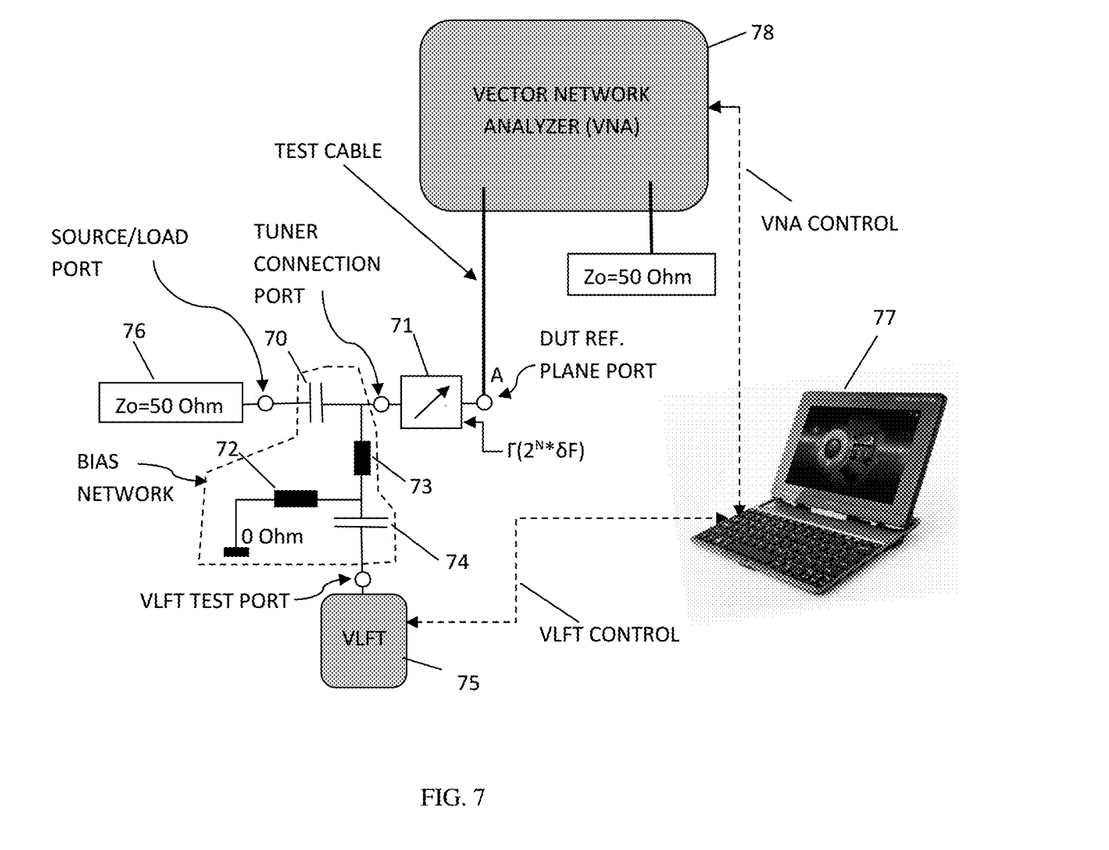
FIG. 7 depicts a calibration setup of the base-band source/load pull test setup using a VLFT.

FIG. 7 shows the computer 77 controlled calibration of the VLFT impedance tuner into reference plane and DUT terminal A, since the impedance tuner 71 and the bias network including items 70, 72, 73 and 74 are part of the base-band network. The calibration data will remain valid only if the system operates in small signal, strictly linear domain and in a steady state non-drifting condition. Changes in gain or phase of the amplifier or LO power will affect the accuracy of the calibration data. The configuration is exactly symmetrical for reference plane and terminal B (see FIG. 2). During calibration the tuner 71 is initialized, i.e. the tuning probe(s) is/are withdrawn from the slabline. The signal source shown in FIG. 2 is replaced by its internal impedance Zo (50 Ohm) 76 (see FIG. 7); the capacitors 70 and 74 and the inductors 73 and 72 are the same as in FIG. 2. The DC supply 22 (battery or electronic) is replaced by its internal resistance of 0 Ohm (short circuit). Calibration consists of measuring by the pre-calibrated VNA 78 the reflection factor S11 ($\Gamma$(Fi)) at point A and a multitude of frequencies {Fi} with Fi=(N+1)*δF or Fi=$2^N*\delta F$ for a multitude of up to $P=2^M$ permutations of the M diodes Di in the digital electronic VLFT tuner 75. Throughout this work the index N starts at N=0 and could reach typical maximum values between 5 and 10. Using the exponential format $2^N$ is a practical choice of frequencies leading to factors 1, 2, 4, 8, 16, 32 . . . because, realistically. a bias network will also have a spread-out frequency response. SF on the other hand can be any number, preferably 50 kHz, 100 kHz etc. Such choice would adequately cover the base-band frequency spectrum; this choice determines also the number of frequencies to be calibrated. As a rule, and because the digital electronic tuner states (permutations of diodes Di) are always the same, the calibration shall execute broadband; i.e., if N=5 and δF=50 kHz, one should calibrate at 50, 100, 200, 400, 800, 1600 kHz at once and save the data in frequency blocks. If the electronic tuner has 10 diodes (FIG. 8) then each frequency sweep, including 32 frequencies (linearly from 50 kHz to 1600 kHz), will have to execute 1024 times, leading to a total calibration time of (typically) 0.04 sec*1024*32≈1.31 minutes, assuming each frequency triggering lasts 40 ms (the number is experimentally verified). If the VNA can be set to operate in a concrete STEP mode, then only the 5 frequencies in the list would have to be measured, reducing the calibration time to a mere 0.21 minutes or around 13 seconds.

This application discloses the concept of a very low frequency heterodyne, broadband, high-speed active impedance tuner. Obvious alternatives shall not impede on the originality of the concept.

What is claimed is:

1. An active load pull tuner, having a test port, comprises:
a base band low frequency section, and
a high frequency section, linked with the base band section using an up- and a down-conversion module, both said modules being driven by a common local oscillator, and
a digital electronic tuning module, residing in the high frequency section, and inserted between the up- and down-conversion modules;
wherein
a coupling module, comprising a power combiner/divider, links a port of a DUT with the active load pull tuner by collecting base band frequency signal from the port of the DUT, injecting it into the up-conversion module, receiving it from the down-conversion module amplified using an amplifier, and re-injecting it into the port of the DUT.

2. The active load pull tuner of claim 1,
wherein
the digital electronic tuning module comprises:
a circulator having ports 1, 2 and 3, and
a digital electronic impedance tuner;
and wherein
port 1 of the circulator is connected with the up-conversion module,
port 2 of the circulator is connected with the digital electronic tuner, and
port 3 of the circulator is connected with the down-conversion module.

3. The active load pull tuner of claim 1,
wherein
the power combiner/divider has a common port and two input/output (I/O) ports, an I/O port 1 and an I/O port 2,
and wherein
the common port is linked with the test port, which is connected with the DUT port,
the I/O port 1 is connected with the up-conversion module,
the I/O port 2 is connected with an output port of the amplifier,
and wherein
an input port of the amplifier is connected with the down-conversion module.

4. The active load pull tuner of claim 1,
wherein
the up-conversion module comprises a first image rejection mixer (IRM1) and the down-conversion module comprises a second image rejection mixer (IRM2).

5. The active load pull tuner of claim 4,
wherein
each image rejection mixer includes a high frequency (RF) port, a local oscillator (LO) port and an intermediate (low) frequency (IF) port,
and wherein
the IF port of the IRM1 is connected with the I/O port 1 of the power combiner/divider,
the LO ports of the IRM1 and the IRM2 are connected with the local oscillator, and
the RF port of the IRM1 is connected to port 1 of the circulator and the RF port of the IRM2 is connected to port 3 of the circulator.

6. The active load pull tuner of claim 5,
wherein
a low pass filter is inserted between the IF port of the IRM2 and the input port of the amplifier.

7. A calibration method for the active load pull tuner of claim 1 at a multitude of M≥100 states of the digital electronic tuner and a multitude N>1 of frequencies $F_i$ with 1≤i≤N, comprising the following steps:
a) connect a RF&DC port of a bias network to a first port of a slide screw tuner and terminate a RF port of the bias network with Zo;
b) connect a DC port of the bias network with the test port of the active load pull tuner;
c) connect a second port of the slide screw tuner to a pre-calibrated vector network analyzer (VNA);
d) in a control loop of j states, with j=1, 2, 3 . . . M, of the digital electronic tuner, execute nested frequency sweeps of the N frequencies $F_i$, measure a total of M×N reflection factors $\Gamma(j, F_i)$ as a function of the M states of the digital electronic tuner and the N frequencies and save in a tuner calibration file.

* * * * *